United States Patent
Yoo et al.

(10) Patent No.: US 11,892,767 B2
(45) Date of Patent: Feb. 6, 2024

(54) STUD ATTACHMENT DEVICE AND STUD ATTACHMENT METHOD WITH INDEPENDENT TEMPERATURE/PRESSURE CONTROL

(71) Applicant: Samsung Electronics Co., Ltd., Suwon-si (KR)

(72) Inventors: Byungchul Yoo, Yongin-si (KR); Sunghoon Park, Hwaseong-si (KR); Mun Ja Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 392 days.

(21) Appl. No.: 17/211,165

(22) Filed: Mar. 24, 2021

(65) Prior Publication Data

US 2022/0100076 A1    Mar. 31, 2022

(30) Foreign Application Priority Data

Sep. 29, 2020    (KR) .......................... 10-2020-0126477

(51) Int. Cl.
*G03F 1/22* (2012.01)
*G03F 7/00* (2006.01)

(52) U.S. Cl.
CPC ............ *G03F 1/22* (2013.01); *G03F 7/70983* (2013.01)

(58) Field of Classification Search
CPC ..... G03F 1/22; G03F 1/24; G03F 1/64; G03F 1/68; G03F 1/62; G03F 7/70983
See application file for complete search history.

(56) References Cited

U.S. PATENT DOCUMENTS

| | | | |
|---|---|---|---|
| 8,133,640 B2 | 3/2012 | Lee et al. | |
| 8,159,654 B2 | 4/2012 | Matsushita | |
| 8,681,310 B2 | 3/2014 | Hotzel | |
| 9,256,142 B2 | 2/2016 | Lee-Chih et al. | |
| 2010/0209826 A1 | 8/2010 | Kim et al. | |
| 2014/0253898 A1* | 9/2014 | Lee-Chih | G03F 1/62 355/72 |
| 2018/0329314 A1 | 11/2018 | Kruizinga et al. | |
| 2019/0025717 A1 | 1/2019 | Van Der Meulen et al. | |
| 2019/0072849 A1 | 3/2019 | Lee et al. | |
| 2020/0012204 A1 | 1/2020 | Van Der Meulen et al. | |
| 2020/0057394 A1 | 2/2020 | Kruizinga et al. | |
| 2020/0096882 A1 | 3/2020 | Van Der Meulen et al. | |
| 2020/0133116 A1 | 4/2020 | Hamada | |
| 2020/0166834 A1* | 5/2020 | Wu | G03F 7/70741 |
| 2020/0183268 A1* | 6/2020 | Wu | G03F 1/82 |

FOREIGN PATENT DOCUMENTS

| | | |
|---|---|---|
| JP | 5600921 B9 | 4/2011 |
| KR | 2017-0085118 A | 7/2017 |
| WO | WO-2017050508 A1 * | 3/2017 |

* cited by examiner

*Primary Examiner* — Peter B Kim
(74) *Attorney, Agent, or Firm* — Harness, Dickey & Pierce, P.L.C.

(57) ABSTRACT

A stud attachment device for attaching a plurality of studs to a photomask constituting a reticle. The stud attachment device including a body; a plurality of holders extending from the body, the holders allowing the studs to be laid thereon, respectively; and a pressure regulator for independently controlling pressures of the holders when the studs are attached to the photomask.

19 Claims, 12 Drawing Sheets

STUD ATTACHMENT DEVICE AND STUD ATTACHMENT METHOD WITH INDEPENDENT TEMPERATURE/PRESSURE CONTROL

CROSS-REFERENCE TO THE RELATED APPLICATION

This application claims priority from Korean Patent Application No. 10-2020-0126477, filed on Sep. 29, 2020, in the Korean Intellectual Property Office, the disclosure of which is incorporated herein by reference in its entirety.

BACKGROUND

1. Field

Example embodiments of the disclosure relate to a stud attachment device and/or a stud attachment method. For example, at least some example embodiments of the disclosure relate to a stud attachment device and/or a stud attachment method for manufacture of a reticle used in a photolithography process using extreme ultraviolet (EUV) light.

2. Description of the Related Art

An advanced lithography process is being developed in order to achieve a reduced feature size. For example, use of extreme ultraviolet (EUV) lithography has been proposed to achieve a micro feature size. A EUV lithography process generally uses a reflective optical device due to excessive absorption of EUV radiation by a material. However, existing EUV lithography processes may cause a problem associated with device pattern uniformity or degradation in lithography performance due to a shadow effect.

A photomask and a pellicle for protecting the photomask may be used for a photolithography process using EUV light. A frame of the pellicle may be attached to the photomask in order to attach the photomask to the pellicle. When the frame of the pellicle is attached to the photomask, the same temperature and the same pressure may be applied to attachment portions of the frame of the pellicle due to the shape of the frame.

Due to application of the same temperature and the same pressure to attachment portions of the frame of the pellicle, a variation in registration in the photomask may occur. In particular, since formation of a micropattern at the photomask may be used in photolithography using EUV light, research into minimization of registration errors is being conducted.

SUMMARY

Example embodiments of the disclosure provide a stud attachment device and/or a stud attachment method capable of independently controlling a temperature and a pressure for attachment positions upon attaching a pellicle to a photomask at the attachment positions.

The example embodiments of the disclosure also provide a stud attachment device and/or a stud attachment method capable of reducing or, alternatively, minimizing) or correcting registration errors upon attaching a pellicle to a photomask.

According to an example embodiment of the present disclosure, there is provided a stud attachment device configured to attach a plurality of studs to a photomask, the stud attachment device including a body; a plurality of holders extending from the body, the plurality of holders configured to receive the plurality of studs laid on respective ones thereof; and a pressure regulator configured to independently control pressures of the plurality of holders while the stud attachment device attaches the plurality of studs to the photomask.

According to an example embodiment of the present disclosure, there is provided a method of attaching a plurality of studs to a photomask using a stud attachment device, the stud attachment device including a body, and a plurality of holders extending from the body, the plurality of holders configured to receive the plurality of studs laid on respective ones thereof, the method including measuring registration errors of the photomask; attaching the plurality of studs to the photomask; and independently controlling one or more of pressures or temperatures of the plurality of holders while the stud attachment device attaches the plurality of studs to the photomask.

According to an example embodiment of the present disclosure, there is provided a stud attachment device configured to attach a plurality of studs to a photomask, the stud attachment device comprising: a body; a plurality of holders extending from the body, the plurality of holders configured to receive the plurality of studs laid on respective ones thereof; a pressure regulator configured to independently control pressures of the plurality of holders while the stud attachment device attaches the plurality of studs to the photomask; and a temperature regulator configured to independently control temperatures of the plurality of holders while the stud attachment device attaches the plurality of studs to the photomask, wherein the plurality of studs are configured to couple the photomask to a pellicle to form a reticle that includes the photomask, the pellicle, and the plurality of studs, and the pellicle includes, a thin-film membrane having a transmissivity of about 80% or more for extreme ultraviolet (EUV) light, a support member at an edge of the thin-film membrane, the support member configured to support the thin-film membrane, a plurality of fixtures configured to couple to respective ones of the plurality of studs, and a frame including a plurality of grooves configured to receive respective ones of the plurality of fixtures, the frame configured to support the support member.

It will be appreciated by persons skilled in the art, to which example embodiments pertain, that technical problems to be solved by the example embodiments are not limited to the above-described technical problems, and other technical problems will be more clearly understood from the following description.

DETAILED DESCRIPTION

Figure 1:
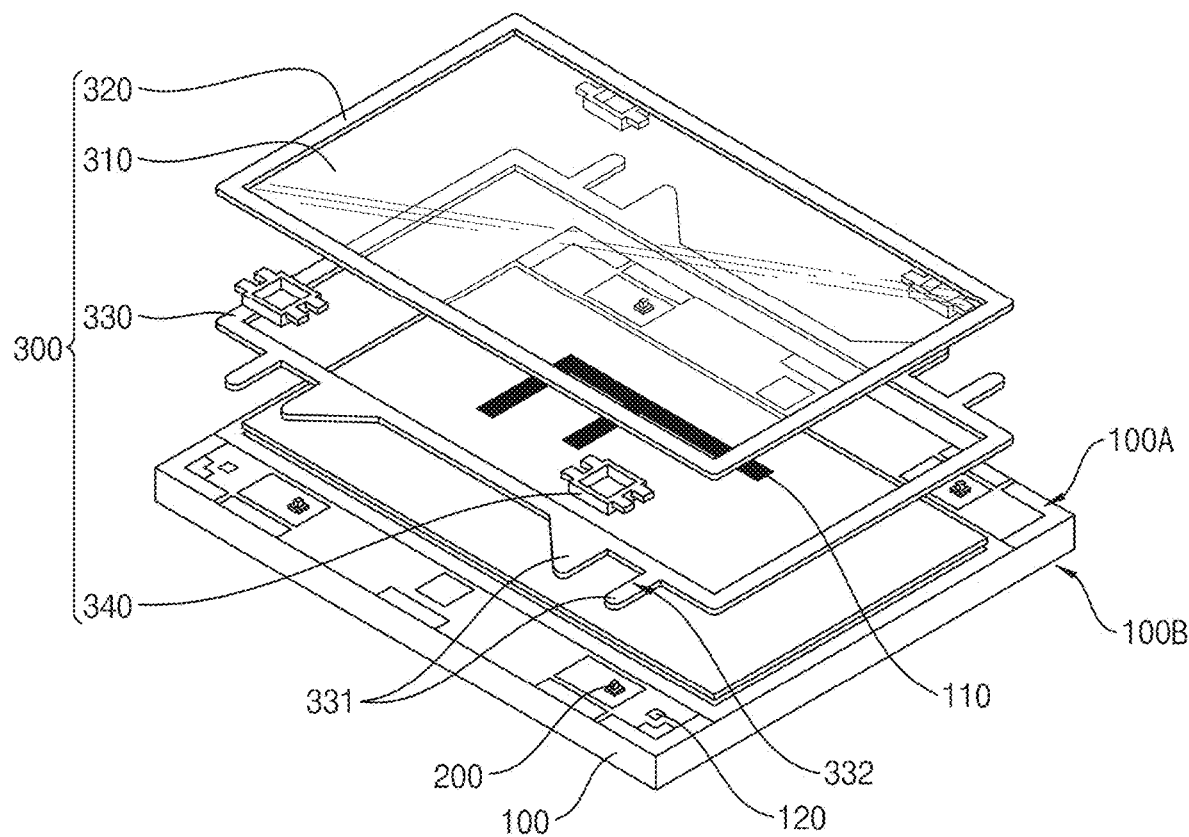
FIG. 1 is an exploded perspective view of a reticle manufactured through a stud attachment device according to an example embodiment of the disclosure.
Figure 2:
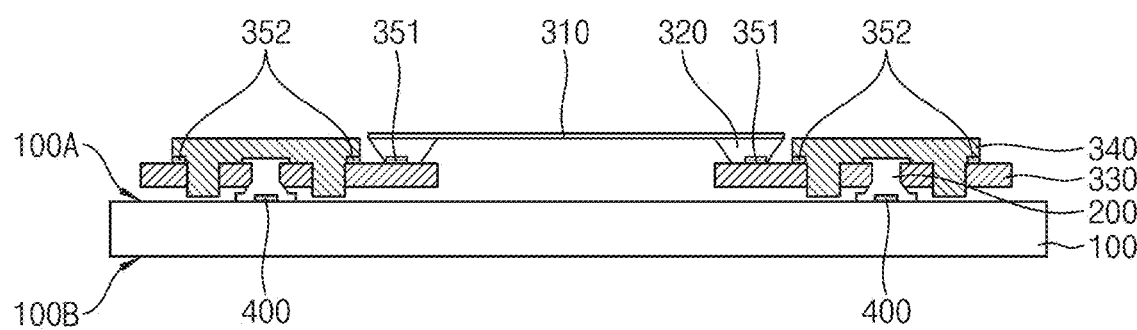
FIG. 2 is a sectional view of the reticle manufactured through the stud attachment device according to the example embodiment of the disclosure.
Figure 3:
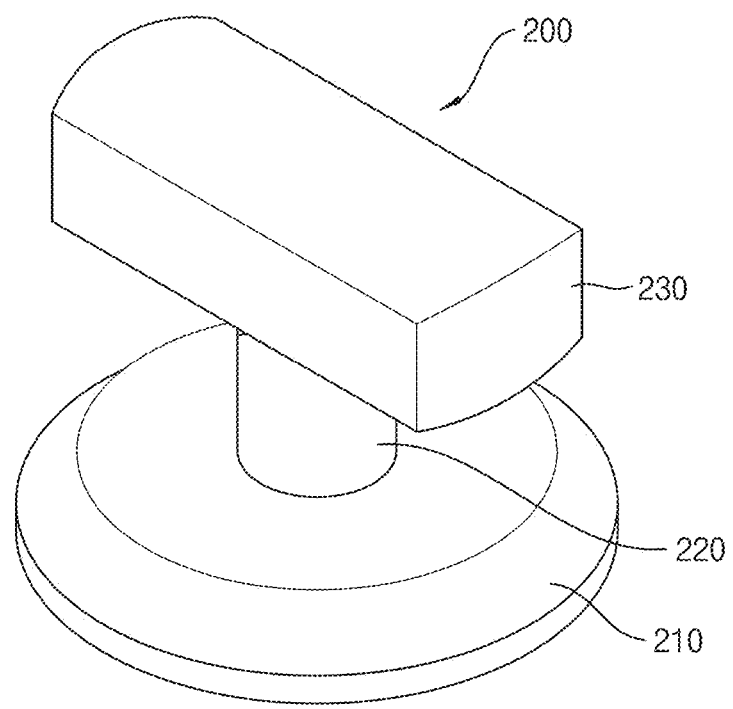
FIG. 3 is a perspective view of a stud according to an example embodiment of the disclosure.

FIG. 1 is an exploded perspective view of a reticle manufactured through a stud attachment device according to an example embodiment of the disclosure. FIG. 2 is a sectional view of the reticle manufactured through the stud attachment device according to the example embodiment of the disclosure. FIG. 3 is a perspective view of a stud according to an example embodiment of the disclosure.

A light exposure device is used in a photolithography process. That is, the light exposure device may perform a photolithography process. The light exposure device may pattern a resist layer formed on a substrate to be a target, using light having a desired (or, alternatively, a predetermined) wavelength. Such a light exposure device includes a light source (not shown) to emit light having a desired (or, alternatively, a predetermined) wavelength, a photomask 100 to perform light exposure using light emitted from the light source, and a pellicle 300 to protect the photomask 100. Here, a coupled structure of the photomask 100 and the pellicle 300 may be referred to as a "reticle 10". Here, the light source may emit light in a short wavelength range for formation of a micropattern on a resist layer.

In detail, the light source may emit light having a wavelength in an extreme ultraviolet (EUV) range. For example, the light may be electromagnetic radiation having a wavelength of about 13 to 14 nm. In some cases, such radiation is referred to as soft x-ray radiation. EUV radiation may be produced using plasma. The light source may include a laser for exciting a fuel in order to provide a light source plasma for production of EUV radiation, and a source collector module for receiving plasma. For example, plasma may be produced by directing a laser beam to a fuel such as particles of a suitable material (for example, tin) or directing a laser beam to a suitable gas or vapor such as Xe gas or Li vapor. Generally, such a light source is referred to as a "laser-produced plasma (LPP) source". Alternative sources may include a discharge plasma source or a source based on synchrotron radiation provided by an electron storage ring.

In EUV lithography, selection of wavelength may be limited by practical considerations involving the availability of suitable radiation sources, optical components and process materials. Current EUV lithography processes all operate using radiation wavelengths in a range of 13 to 14 nm, and there is large volume of research that must be conducted before EUV lithography can be used for mass production. EUV radiation having a wavelength of less than 11 nm may be used, for example, in a range of 5 to 10 nm or 1 to 8 nm, and especially in a so-called "6.x" nm wavelength range of 6.5 to 6.9 nm (for example, 6.7 nm or 6.8 nm). Such a short-wavelength EUV lithography process may provide better resolution (features less than an 11 nm node), greater depth of focus (DOF) and higher throughput, as compared to those of currently-used wavelengths (for example, 13.5 nm).

Referring to FIGS. 1 to 3, in an example embodiment, the reticle 10 may include the photomask 100, the pellicle 300, and a plurality of studs 200 to couple the photomask 100 and the pellicle 300. In an example embodiment, the pellicle 300 may include a membrane 310, a support member 320, a frame 330, and a fixture 340.

The photomask 100 may perform light exposure for a resist layer formed on a substrate to be a target, using light in an EUV range emitted from a light source (not shown). The photomask 100 may include a pattern surface 100A including a mask pattern 110 provided in a desired (or, alternatively, a predetermined) form, and an opposite surface 100B.

In accordance with an example embodiment, the opposite surface 100B of the photomask 100 may be harder than the pattern surface 100A. The pattern surface 100A of the photomask 100 may be, for example, one surface of a multilayer reflective film or one surface of a capping layer on a multilayer reflective film.

The mask pattern 110 formed at the pattern surface 100A includes a plurality of layout patterns. The mask pattern may represent a feature of a semiconductor device to be patterned on a semiconductor wafer, for example, a gate line for a metal oxide semiconductor (MOS) transistor. In an example embodiment, the mask pattern may include a tantalum boron nitride (TaBN) component and/or a lawrencium component.

In accordance with an example embodiment, an alignment key 120 may be formed at the outside of the mask pattern 110 within the pattern surface 100A. The alignment key 120 may include a function of achieving easy alignment when the studs 200 are attached to the photomask 100 or when the pellicle 300 is attached to the photomask 100.

For example, the opposite surface 100B may be one surface of the substrate, which is made of dielectrics, glass, semiconductor or a metal material, or one surface of a backside conductive film or an energy absorbing layer.

In an example embodiment, the photomask 100 may include a reflection type mask. In this case, light in an EUV range emitted from a light source may be incident upon the photomask 100 after passing through the pellicle 300. The light in the EUV range reflected from the photomask 100 may be incident upon the resist layer after passing through the pellicle 300. In this case, the photomask 100 may include a reflective layer for reflecting light in an EUV range, and the mask pattern 110 may include an absorption pattern for absorbing light in an EUV range. Meanwhile, although not shown, the light exposure device may further include an optical system such as a focusing lens for focusing light in an EUV range exiting from the reticle 10.

The photomask 100 is not limited to various materials and layers disclosed in the disclosure. Other materials and layer configurations may be used for an alternative photomask 100.

The pellicle 300 may be disposed on the pattern surface 100A of the photomask 100 such that the pellicle 300 covers the mask pattern 110. As the pellicle 300 is disposed on the pattern surface 110A of the photomask 110, the pellicle 300 inhibits (or, alternatively, prevents) external contaminants such as dust or resist from being adsorbed to the photomask 110 and, as such, includes a function of protecting the photomask 100. To this end, the pellicle 300 may include the membrane 310 which is disposed to be spaced apart from the photomask 100 by a desired (or, alternatively, a predetermined) distance. For example, the membrane 310 may be disposed to be spaced apart from the photomask 100 by a distance of about 1 to 10 mm.

The membrane 310 may have the form of a thin film. The membrane 310 may have transmissivity for light. For example, the membrane 310 may have transmissivity of about 80% or more for EUV light. The membrane 310 may be made of various materials having high transmissivity for light emitted from the light source, for example, EUV light.

In some example embodiments, the membrane 310 may include silicon. For example, the membrane 310 may include polycrystalline silicon, monocrystalline silicon, silicon nitride, or a combination thereof.

In some example embodiments, the membrane 310 may include a carbon-based material. For example, the membrane 310 may include amorphous carbon, graphene, nanometer-thickness graphite, a carbon nanosheet, a carbon nanotube, silicon carbide (SiC), boron carbide ($B_4C$), or a combination thereof. For example, the membrane 310 may include nanocrystalline graphene. The nanocrystalline graphene may include a plurality of nanoscopic crystal grains. The plurality of crystal grains may include a two-dimensional carbon structure having an aromatic ring structure. The plurality of crystal grains may have a size of several hundred nm or less, for example, about 100 nm or less. The two-dimensional carbon structure may have a layered structure in which carbon atoms are two-dimensionally arranged. The crystal grains of the nanocrystalline graphene may include a defect. For example, the defect may include at least one of an sp3 carbon (C) atom, a hydrogen (H) atom, an oxygen (O) atom, a nitrogen (N) atom and a carbon vacancy.

In some example embodiments, the membrane 310 may include a semiconductor material having a crystalline structure having a two-dimensional shape. For example, the membrane 310 may include transition metal dichalcogenide (TMD). For example, the transition metal dichalcogenide may include one metal element from among Mo, W, Nb, V, Ta, Ti, Zr, Hf, Tc, Re, Cu, Ga, In, Sn, Ge and Pb, and one chalcogen element from among S, Se and Te.

In some example embodiments, the membrane 310 may include a fluorine-based polymer.

In some example embodiments, the membrane 310 may have a single-layer structure or a multilayer structure. For example, the membrane 310 may have a multilayer structure made of a combination of the materials as illustrated above. In addition, the membrane 310 may further include a protective layer coupled to one surface or both surfaces of a layer constituting the membrane 310 while including SiC, SiO2, Si3N4, SiON, Y2O3, YN, Mo, Ru, Rh, BN, B4C, B, or a combination thereof.

In an example embodiment, the membrane 310 may have a thickness of about 200 nm or less, for example, 1 to 100 nm.

The pellicle 300 may include the support member 320 which is disposed at an edge (periphery) of the membrane 310. In an example embodiment, the support member 320 may be disposed on an edge of one surface of the membrane 310, and may support the membrane 310. The support member 320 may have a ring shape (for example, a quadrangular ring shape) corresponding to an edge shape of the membrane 310.

In an example embodiment, the support member 320 may be made of silicon. For example, the support member 320 may be obtained through etching of a silicon wafer.

The frame 330 may be provided at a peripheral portion of the photomask 100 and, as such, may have a function of supporting the membrane 310 such that the membrane 310 is spaced apart from the photomask 100 by a desired (or, alternatively, a predetermined) distance. For example, as the support member 320 is disposed on the frame 330, and the membrane 310 is disposed on the support member 320, the frame 330 may support the membrane 310 through the support member 320. In an example embodiment, the frame 330 may be disposed to be spaced apart from the photomask 100 within the reticle 10. The frame 330 may have a substantially ring shape (for example, a quadrangular ring shape). The frame 330 may include a plurality of protrusions 331 protruding outwards. Each protrusion 331 may have a substantially U-shaped groove 332, without being limited as to the shape of the groove 332. For example, the plurality of protrusions 331 may protrude outwards of the membrane 310. In an embodiment, the frame 330 may include four protrusions 331. For example, when the frame 330 has a quadrangular ring shape, the protrusions 331 may be formed such that two protrusions 331 are formed at each of two parallel sides (for example, two longer sides). In another example, when the frame 330 has a quadrangular ring shape, the protrusions 331 may be formed such that one protrusion 331 is formed at each side.

In an example embodiment, the frame 330 may include a metal having excellent heat dissipation and excellent strength. For example, the frame 330 may include aluminum, anodic aluminum oxide, stainless steel (SUS), diamond-like carbon (DLC), treated aluminum, DLC-treated SUS, silicon, etc.

A plurality of fixtures 340 may be provided at the pellicle 300. The plurality of fixtures 340 may be disposed at the grooves 332 of the protrusions 331 of the frame 330, respectively. The grooves 332 formed at the frame 330 may receive the fixtures 340, respectively. For example, four fixtures 340 may be coupled to the grooves 332 of the protrusions 331 of the frame 300, respectively. The fixtures 340 may be coupled to the studs 200 attached to the photomask 100, respectively. For example, the fixtures 340 may be easily attached to and detached from the studs 200, respectively. Each fixture 340 may include an engagement member engageable with a head of the corresponding stud 200.

In an example embodiment, the pellicle 300 may include a first bonding member 351 and a second bonding member 352. For example, the pellicle 300 may include at least one first bonding member 351 and at least one second bonding member 352.

The support member 320 and the frame 330 may be coupled to each other under the condition that the first bonding member 351 is interposed between the support member 320 and the frame 330. In addition, the frame 330 and the fixture 340 may be coupled to each other under the condition that the second bonding member 352 is interposed between the frame 330 and the fixture 340. Although the first bonding member 351 and the second bonding member 352 are not limited as to the kinds thereof, the first bonding member 351 and the second bonding member 352 may include a polyphenol compound having two or more hydroxy groups and a polymer or polyvinyl alcohol having a hydroxy group and an amine group.

Each stud 200 includes a body 210 attached to the pattern surface 100A of the photomask 100 while having a substantially plate shape (for example, a disc shape), a post 220 extending from the body 210 while having a column shape (for example, a cylindrical shape), and a head 230 formed at an end of the post 220. The post 220 may connect the body 210 and the head 230 to each other. In an example embodiment, the head 230 has a substantially rectangular plate shape, and the length of longer sides thereof is slightly smaller than the diameter of the body 210. The head 230 can be coupled to the corresponding fixture 340. The body 210 of the stud 200 may be attached to the outside of a region of the photomask 100 where the mask pattern 110 is formed. The body 210 of the stud 200 may be directly attached to the photomask 100 by a third bonding member 400.

In an example embodiment, the number of studs 200 may be equal to the number of fixtures 340. For example, when four fixtures 340 are provided, four studs 200 may be attached to the pattern surface 100A at positions corresponding to the fixtures 340, respectively.

In an example embodiment, the reticle 10 may include a plurality of third bonding members 400. The plurality of third bonding members 400 may be disposed at the studs 200, respectively. For example, each third bonding member 400 may be disposed at one surface of the body 210 of the corresponding stud 200 (for example, a lower surface of the body 210 of the stud 200 in FIG. 3).

In an example embodiment, each stud 200 may be attached to the photomask 100 under the condition that the corresponding third bonding member 400 is interposed between the stud 200 and the photomask 100. Although this embodiment is not limited as to the material of the third bonding member 400, the third bonding member 400 may include a thermosetting material in some example embodiments. In some example embodiments, the third bonding member 400 may include a material illustrated in association with the first bonding member 351 or the second bonding member 352.

Figure 4:
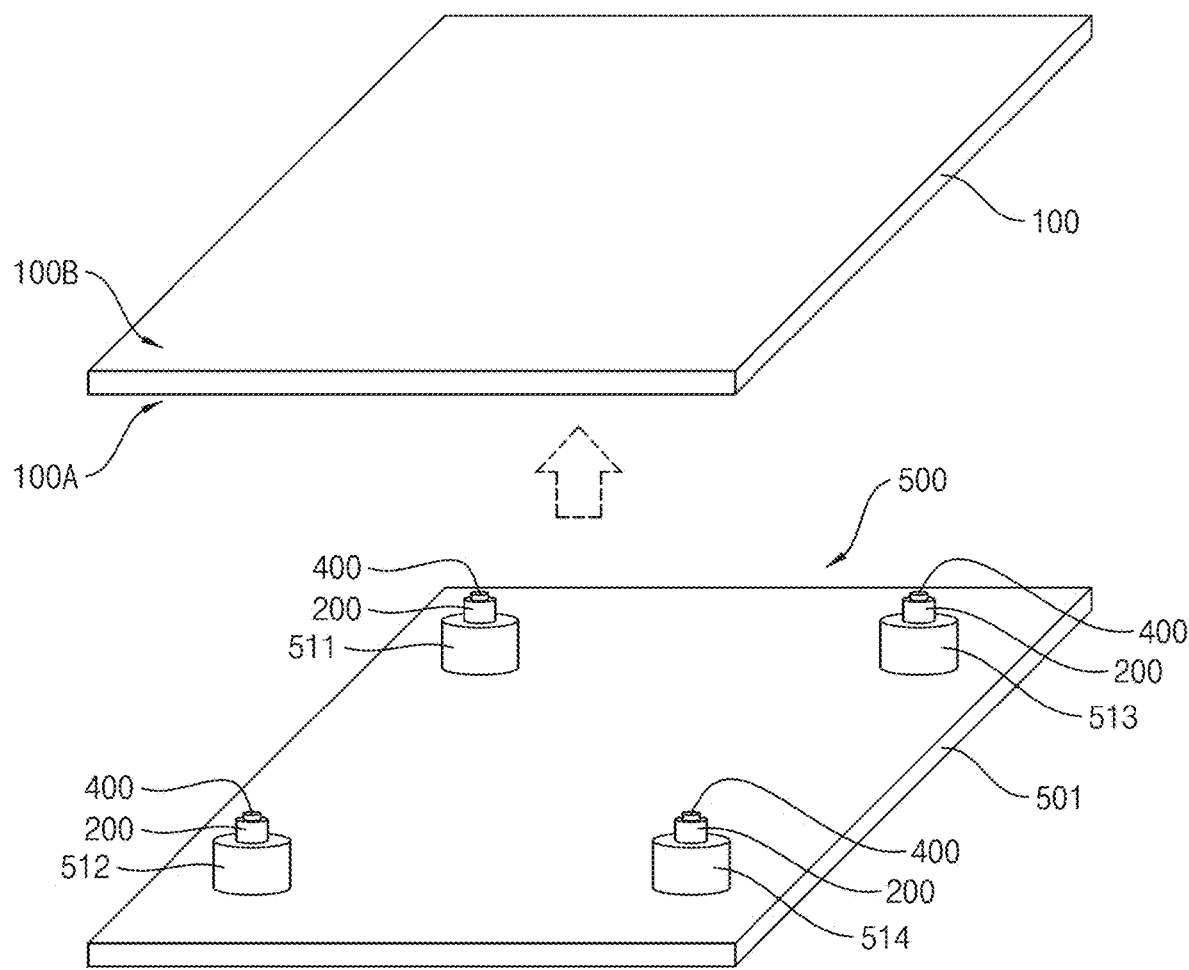
FIG. 4 is a schematic perspective view of a stud attachment device according to an example embodiment of the disclosure.
Figure 5:
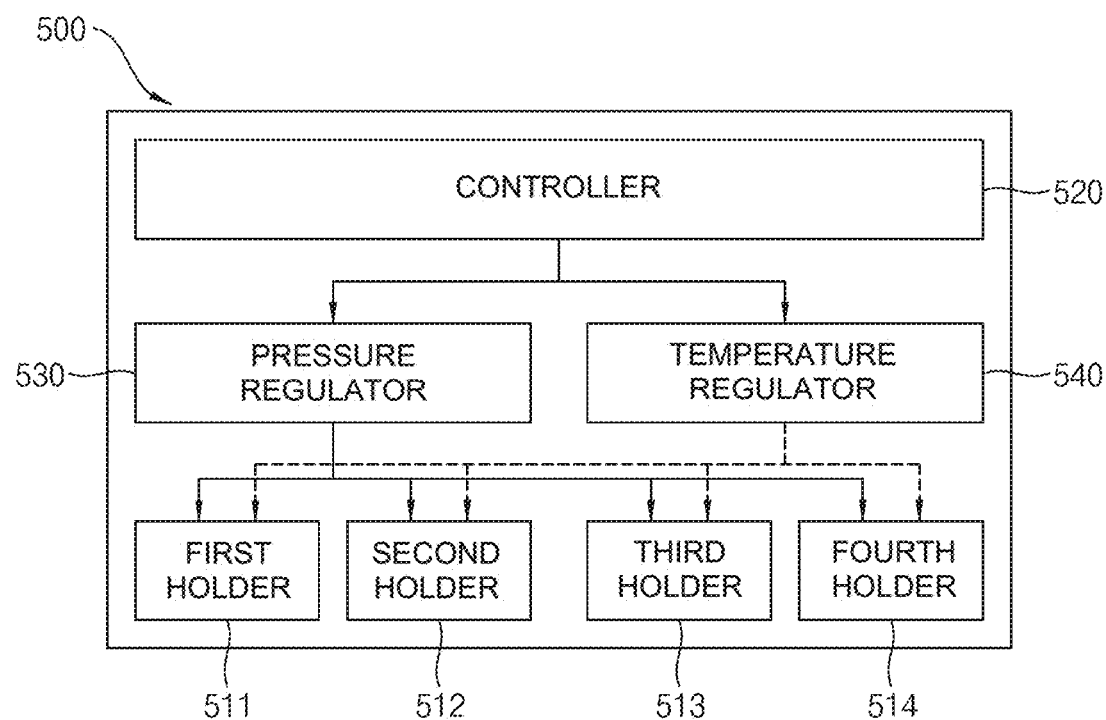
FIG. 5 is a schematic block diagram of the stud attachment device according to the example embodiment of the disclosure. For convenience of description, the photomask 100 is additionally shown in FIG. 4.

FIG. 4 is a schematic perspective view of a stud attachment device according to an example embodiment of the disclosure. FIG. 5 is a schematic block diagram of the stud attachment device according to the example embodiment of the disclosure. For convenience of description, the photomask 100 is additionally shown in FIG. 4.

Referring to FIGS. 4 and 5, a stud attachment device 500 may attach the studs 200 to the photomask 100. In an example embodiment, the stud attachment device 500 may include a body 501, and a plurality of holders 511 to 514 extending from the body 501 or extendable from the body 501.

In an example embodiment, the stud attachment device 500 may further include a pressure regulator 530, a temperature regulator 540, and a controller 520.

In an example embodiment, the body 501 and the plurality of holders 511 to 514 of the stud attachment device 500 may determine the whole shape of the stud attachment device 500. The body 501 may fix the plurality of holders 511 to 514, and may enclose the pressure regulator 530, the temperature regulator 540, and the controller 520 which are disposed therein.

The studs 200 may be laid on the photomask 100 at one-side surfaces (for example, upper surfaces) of the first to fourth holders 511 to 514, respectively (for example, before the studs 200 are attached to the photomask 100). In this specification, "laid on" comprehensively means that a first constituent element is disposed to contact a second constituent element, is attached to the second constituent element, or is coupled to the second constituent element. One stud 200 may be coupled to each of the first to fourth holders 511 to 514. The head 230 of each stud 200 may be coupled to the corresponding holder. In an example embodiment, each holder may include an engagement member easily engageable with the head 230 of the corresponding stud 200. One third bonding member 400 may be attached to one surface of the body 210 of each stud 200 (for example, an upper surface of the stud 200 in FIG. 4).

In an example embodiment, the stud attachment device 500 may include four holders 511 to 514. For example, the four holders 511 to 514 may be disposed on one surface of the body 501. The number of holders 511 to 514 may be equal to the number of studs 200 in the reticle 10. For example, the stud attachment device 500 may include a first holder 511, a second holder 512, a third holder 513, and a fourth holder 514. For convenience of description, it is assumed that, in the stud attachment device 500, when viewed in a top view, the first holder 511 is disposed at a left upper side, the second holder 512 is disposed at a left lower side, the third holder 513 is disposed at a right upper side, and the fourth holder 514 is disposed at a right lower side.

Positions of the first to fourth holders 511 to 514 may correspond to positions at which four studs 200 are to be attached to the photomask 100, when the studs 200 will be attached to the photomask 100, or positions of four fixtures 340 of the pellicle 300 when the pellicle 300 will be coupled to the photomask 100, respectively.

Each of the first to fourth holders 511 to 514 may independently apply a pressure and/or a temperature to the stud 200 attached to one surface thereof upon attaching the stud 200 to the photomask 100.

In an example embodiment, each of the first to fourth holders 511 to 514 may independently move upwards and downwards. Accordingly, each of the first to fourth holders 511 to 514 may enable independent pressure regulation. For example, the first to fourth holders 511 to 514 may apply different pressures to the studs 200, respectively, upon attaching the studs 200 to the photomask 100. In an example embodiment, each of the first to fourth holders 511 to 514 may include a piston device, a gas cylinder, an electric motor, or the like, which can regulate pressure.

In an example embodiment, each of the first to fourth holders 511 to 514 may independently regulate temperature (heat). Accordingly, each of the first to fourth holders 511 to 514 may independently apply heat to the corresponding stud 200. For example, the first to fourth holders 511 to 514 may apply heat of different temperatures to the studs 200 upon attaching the studs 200 to the photomask 200, respectively. In an example embodiment, each of the first to fourth holders 511 to 514 may regulate a temperature thereof, and may include electric heating equipment capable of electrically applying heat to the corresponding stud 200.

The pressure regulator 530 may independently regulate pressures of the first to fourth holders 511 to 514. For example, the pressure regulator 530 may independently control forces causing the first to fourth holders 511 to 514 to ascend or ascending heights of the first to fourth holders 511 to 514.

The temperature regulator 540 may independently control temperatures of the first to fourth holders 511 to 514. For example, the temperature regulator 540 may independently apply a voltage or current to the first to fourth holders 511 to 514 and, as such, may independently regulate a temperature of heat emitted from the electric heating equipment provided at each of the first to fourth holders 511 to 514.

The controller 520 may control the pressure regulator 530 and the temperature regulator 540. The controller 520 may include an input unit including a circuit, a memory including at least one instruction, and processing circuitry for executing the at least one instruction.

For example, the processing circuitry may be hardware including logic circuits; a hardware/software combination such as a processor executing software; or a combination thereof and memory. For example, the processing circuitry more specifically may include, but is not limited to, a central processing unit (CPU), an arithmetic logic unit (ALU), a digital signal processor, a microcomputer, a field programmable gate array (FPGA), a programmable logic unit, a microprocessor, application-specific integrated circuit (ASIC), etc.

The controller 520 may executes software (an application program, an operating system (OS), and device drivers), which transforms the controller 520 into a special purpose processor to reduce (or, alternatively, minimize) registration errors generated when the pellicle 300 is attached to the photomask 100 when manufacturing the reticle 10 by independently controlling the pressure and/or heat applied by the holders 511-514 to the studs 200.

Next, an attachment method of the stud attachment device 500 for attaching the studs 200 to the photomask 100 will be described.

Figure 6:
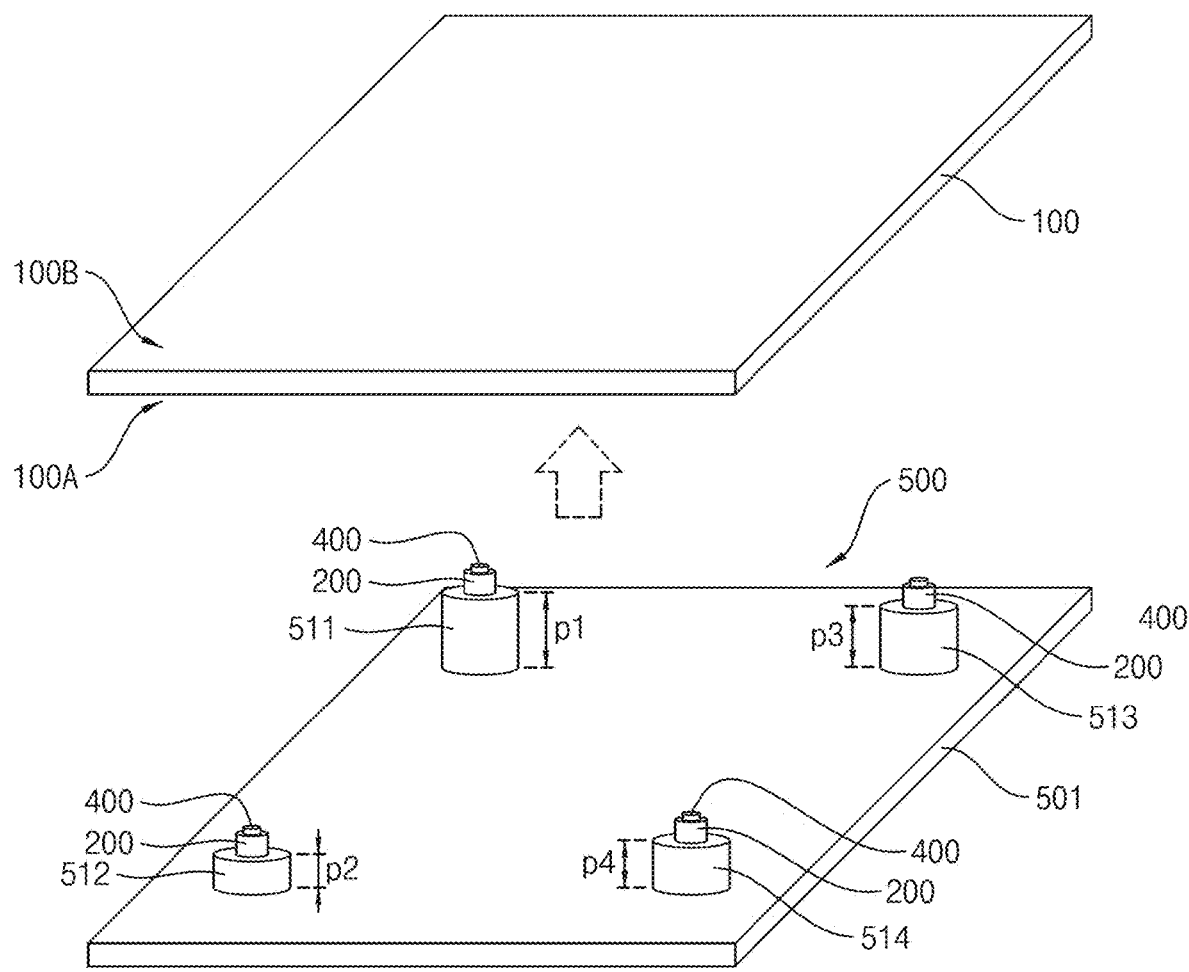
FIG. 6 is a schematic perspective view showing the stud attachment device and the photomask in order to explain a stud attachment method according to an example embodiment of the disclosure.

FIG. 6 is a schematic perspective view showing the stud attachment device and the photomask in order to explain a stud attachment method according to an example embodiment of the disclosure.

For manufacture of the reticle 10, attaching the studs 200 to the photomask 100, and coupling the photomask 100 attached with the studs 200 and the pellicle 300 to each other may be sequentially performed.

Referring to FIGS. 4 to 6, in an example embodiment, when the stud attachment device 500 attaches the studs 200 to the photomask 100, the photomask 100 may be disposed such that the pattern surface 100A thereof faces downwards. Upon attaching the studs 200 to the photomask 100, the stud attachment device 500 may attach the studs 200 to the photomask 100 by applying a desired (or, alternatively, a predetermined) force (for example, a pressure) to each stud 200 in an upward direction (for example, from the downside to the upside).

Upon attaching the studs 200 to the photomask 100, the first holder 511 of the stud attachment device 500 may apply a first pressure p1 to the corresponding stud 200. Similarly, the second holder 512 of the stud attachment device 500 may apply a second pressure p2 to the corresponding stud 200, the third holder 513 of the stud attachment device 500 may apply a third pressure p3 to the corresponding stud 200, and the fourth holder 514 of the stud attachment device 500 may apply a fourth pressure p4 to the corresponding stud 200. In an example embodiment, at least one of the first pressure p1, the second pressure p2, the third pressure p3 and the fourth pressure p4 may differ from the remaining ones. In accordance with an example embodiment, the first to fourth holders 511 to 514 may be set to have heights proportional to the first pressure p1, the second pressure p2, the third pressure p3 and the fourth pressure p4, respectively, just before the stud attachment device 500 attaches the studs 200 to the photomask 100. For example, the first pressure p1 may be greatest, the third pressure p3 may be smaller than the first pressure p1, the fourth pressure p4 may be smaller than the third pressure p3, and the second pressure p2 may be smaller than the fourth pressure p4. Correspondingly, just before the stud attachment device 500 attaches the studs 200 to the photomask 100, the first holder 511 may have a greatest height, and the third holder 513, the fourth holder 514 and the second holder 512 may have greater heights in the stated order, respectively.

Upon attaching the studs 200 to the photomask 100, the stud attachment device 500 may apply, through the first holder 511, heat of a first temperature to the corresponding stud 200. Similarly, the stud attachment device 500 may apply, through the second holder 512, heat of a second temperature to the corresponding stud 200, may apply, through the third holder 513, heat of a third temperature to the corresponding stud 200, and may apply, through the fourth holder 514, heat of a fourth temperature to the corresponding stud 200.

The above-described pressures and temperatures may be pressures and temperatures at which the third bonding member 400 can easily bond respective studs 200 to the photomask 100.

Figure 7:
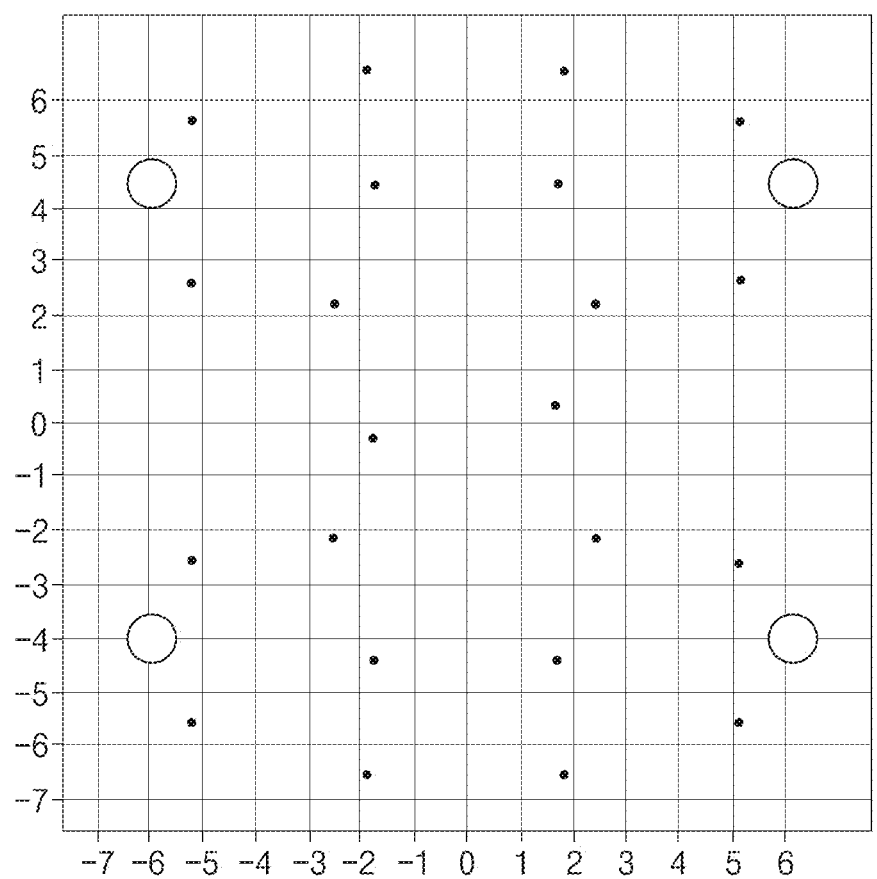
FIG. 7 is a graph depicting registration errors in the photomask according to the example embodiment of the disclosure.
Figure 8:
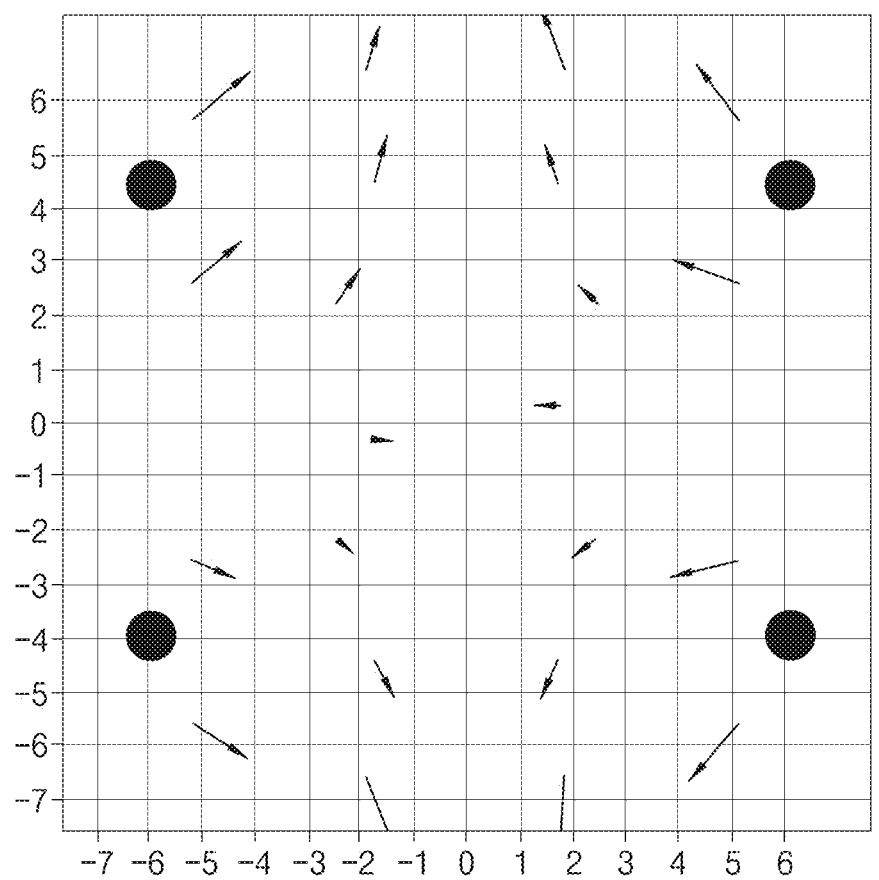
FIGS. 8 and 9 are graphs depicting registration errors in photomasks according to comparative examples, respectively.
Figure 9:
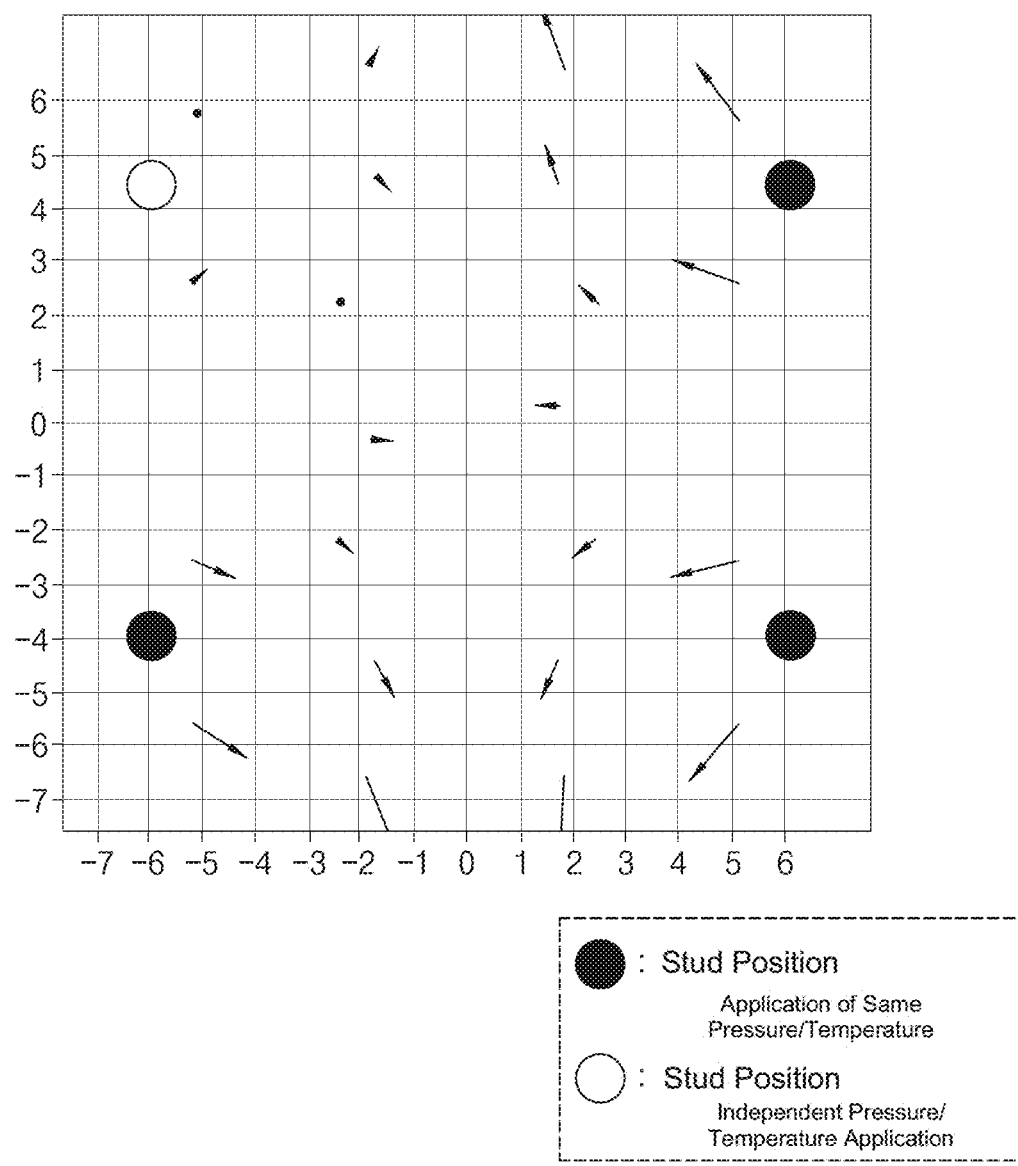
Figure 10:
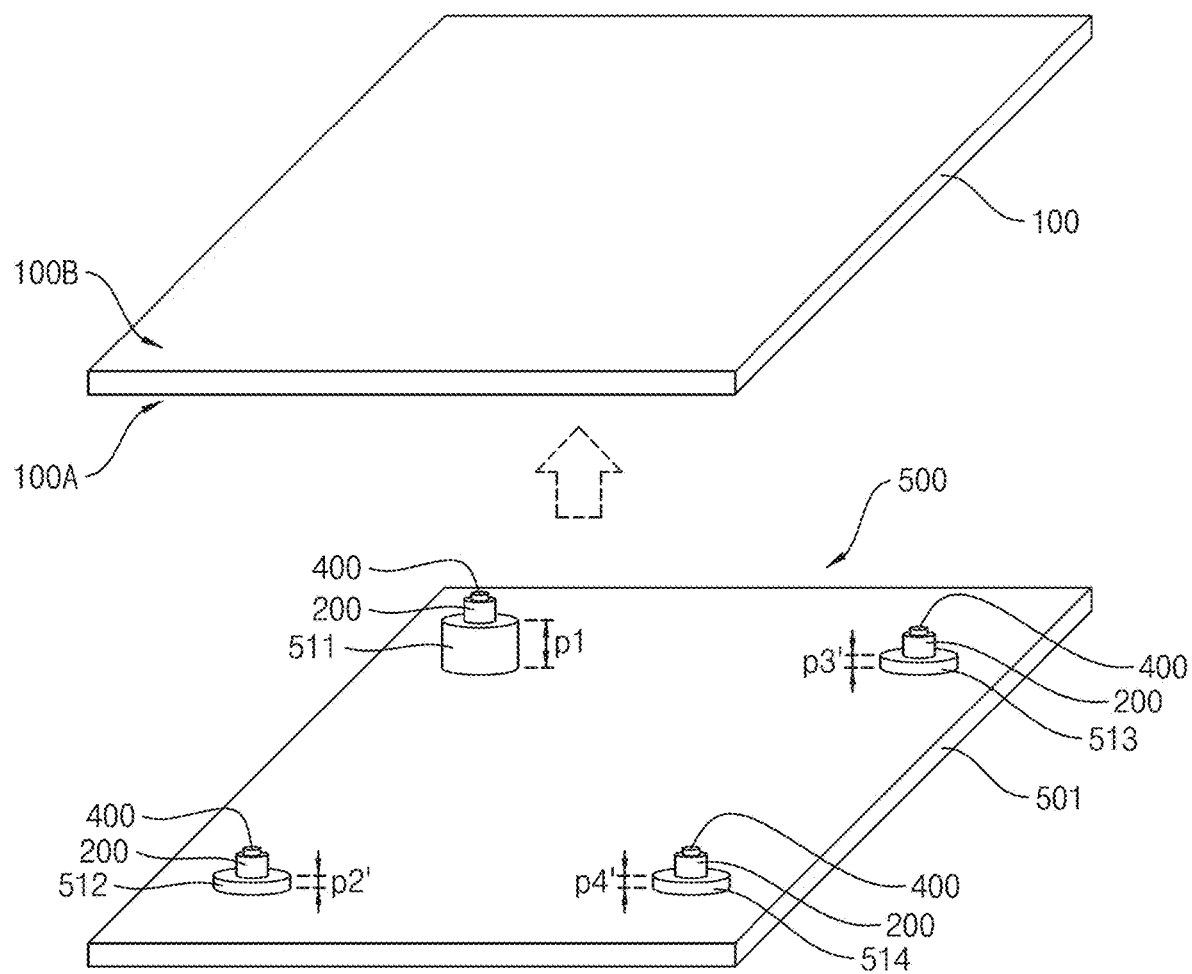
FIGS. 10 to 13 are schematic perspective views showing a stud attachment device and a photomask in order to explain a stud attachment method according to an example embodiment of the disclosure.
Figure 11:
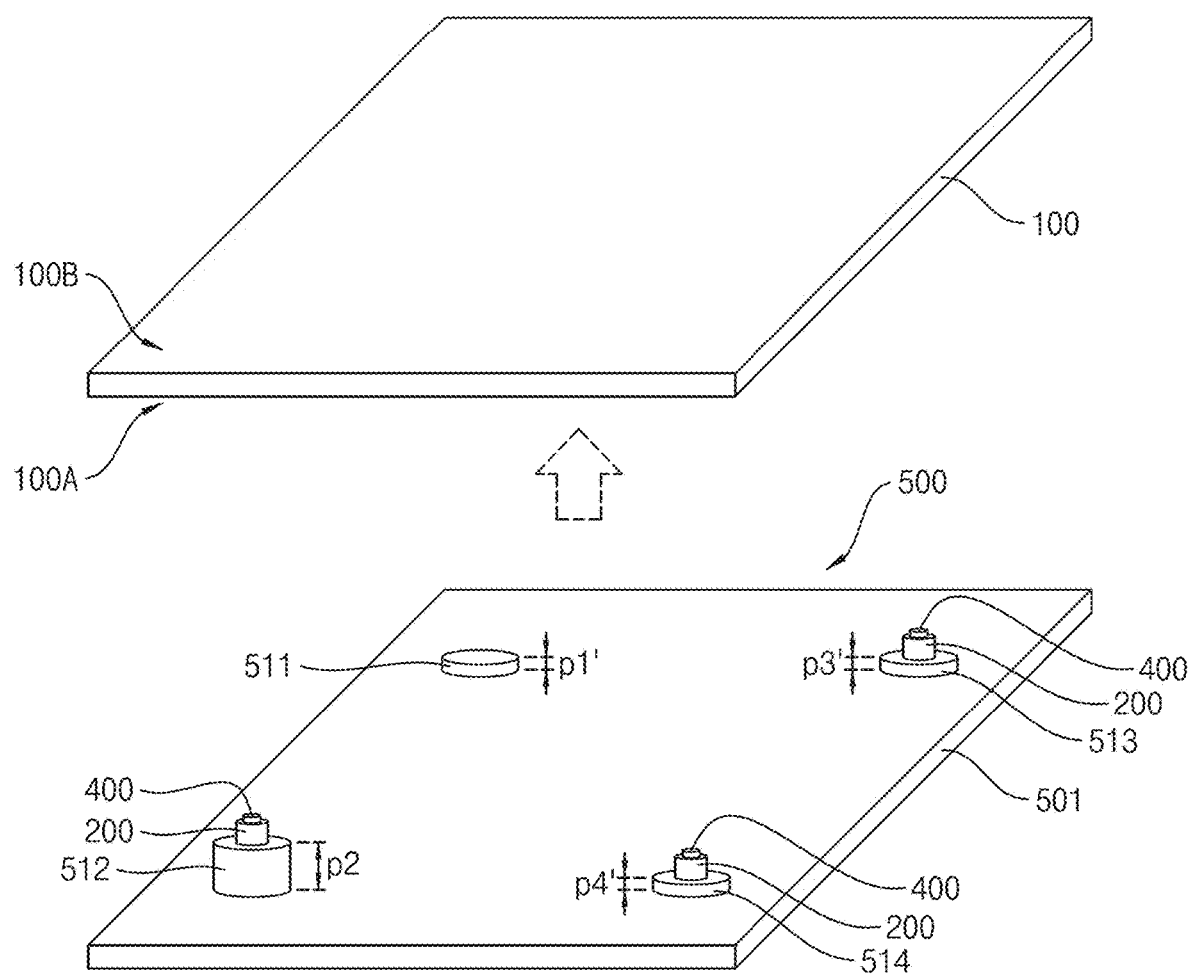
Figure 12:
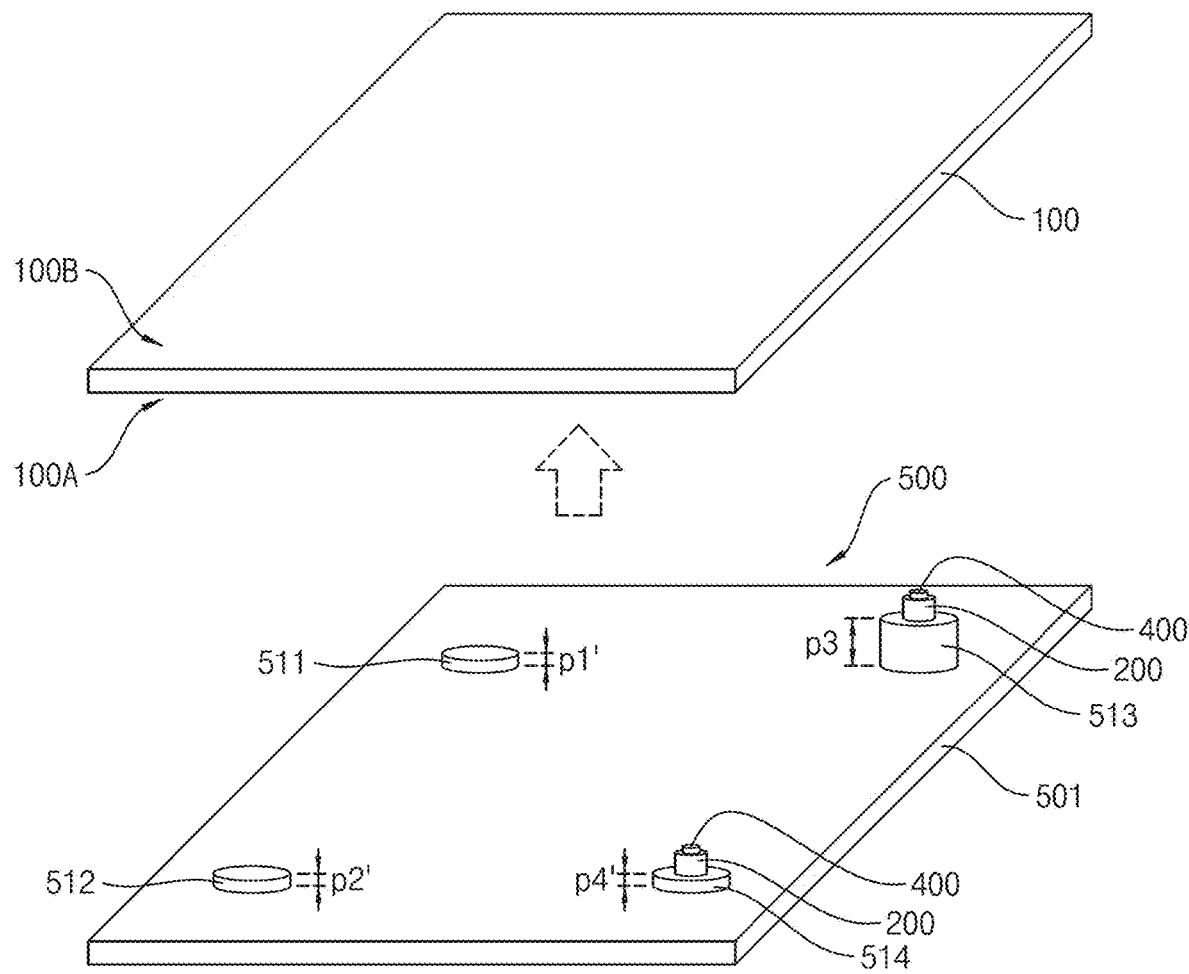
Figure 13:
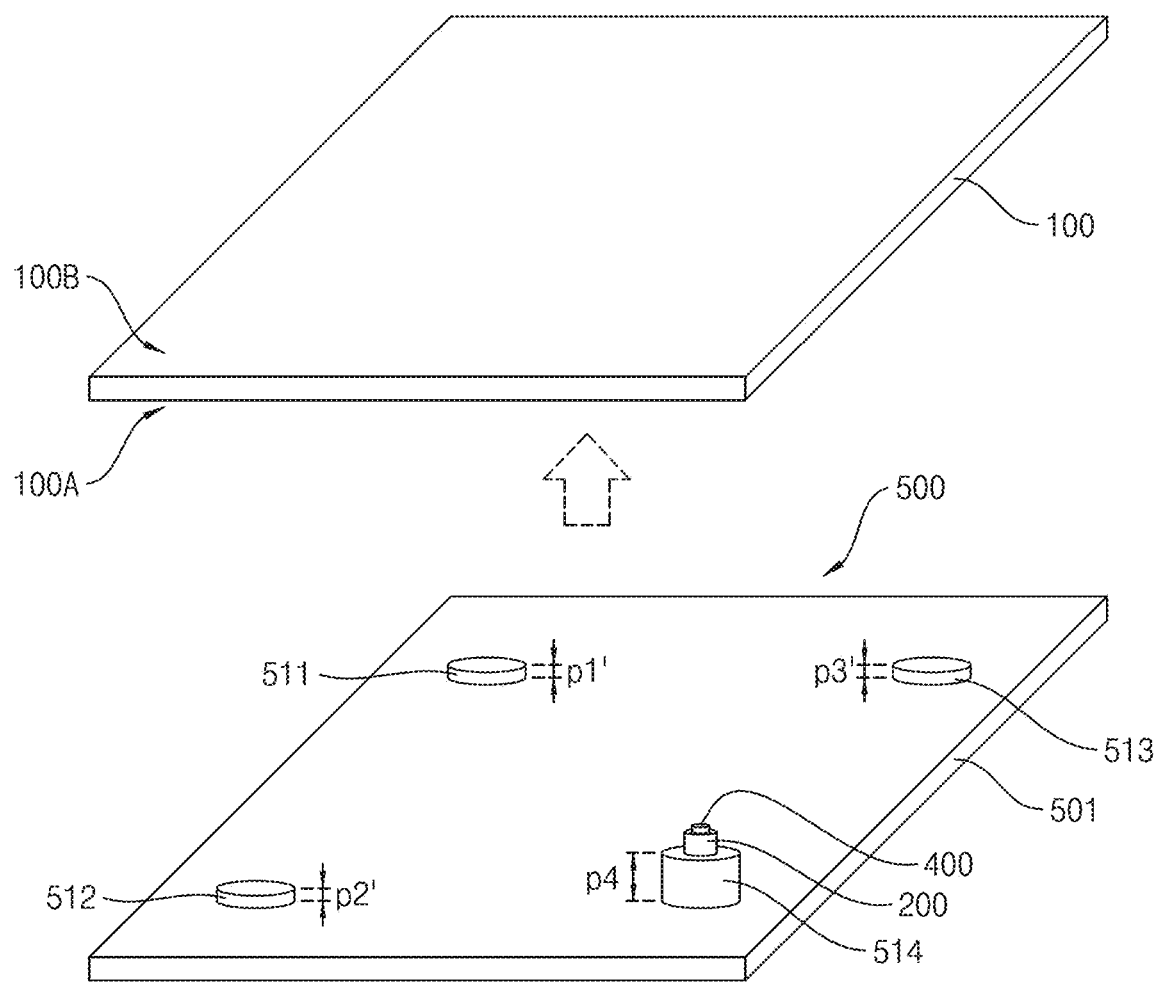

FIG. 7 is a graph depicting registration errors in the photomask according to the example embodiment of the disclosure. FIGS. 8 and 9 are graphs depicting registration errors in photomasks according to comparative examples, respectively.

In FIGS. 7 to 9, x and y-axis factors represent relative coordinates in the photomask 100. Circles in FIGS. 7 to 9 represent relative positions at which studs 200 are attached, respectively. Registration errors mean alignment errors of a pattern.

Generally, registration errors of the photomask 100 may be generated as another constituent element is clamped to the photomask 100, or may be generated due to a flatness error of the photomask 100. Such registration errors may be generated when a part of pattern components on the photomask 100 is incorrectly disposed with respect to predetermined positions thereof. When registration errors of pattern components in the photomask 100 are generated, there may be a problem in that a pattern shape transferred from the pattern components to a photoresist film on a wafer may differ from a pre-designed shape, or may not be transferred to a correct position on the photoresist film.

Distribution of registration errors of the photomask 100 may be represented through a two-dimensional map of arrows, as illustrated in FIGS. 7 to 9. In the two-dimensional map, directions of the arrows represent directions of pattern components on the photomask 100 shifted with respect to a nominal position thereof (x: 0.00 and y: 0.00), respectively, and lengths of the arrows represent amounts of shift, respectively. In addition, dots represented in the two-dimensional map mean that there is little or no shift.

Various equipment (external equipment) may be used in order to detect errors of the photomask 100 (various errors including registration errors). As an illustrative method for detecting a flatness error of the photomask 100, a TROPEL ULTRAFLAT (manufactured by CORNING TROPEL COMPANY) may be used, without being limited thereto. For example, an interferometer manufactured by ZYGO COMPANY or TROPEL COMPANY may also be used.

In an illustrative method for measuring errors of the photomask 100, when the photomask 100 includes a material having a high light-transmitting property in a visible light wavelength range of 300 to 800 nm, for example, silica glass or $TiO_2$—$SiO_2$ glass, whole thickness distributions of the photomask 100 may be measured from an optical path difference between beams reflected from a front-side surface and a backside surface through an interferometer using visible light having a wavelength of 300 to 800 nm as a light source thereof, and a total thickness distribution may be obtained from a difference between maximum and minimum values of balances obtained by deducting a tilting component from the obtained thickness distributions. As an interferometer for the above-described thickness distribution measurement, for example, a product (TROPEL ULTRAFLAT) of CORNING TROPEL COMPANY, a product (Verifier or MarkIV) of ZYGO COMPANY, a product (G310S) of FUJINON Company, etc. may be used.

In another illustrative method for measuring errors of the photomask 100, a shape of the front-side surface of the photomask 100, for example, a front-side surface profile, may be measured using a laser interference type flatness measuring device, a laser displacement gauge, an ultrasonic displacement gauge, a contact type displacement gauge, or the like, and a thickness distribution of the photomask 100 may be calculated from the resultant data.

In another illustrative method, an atomic force microscope (AFM), a scanning tunneling microscope (STM), a stylus profilometer, or an interferometer may be used to measure a front-side surface shape of the photomask 100, as a means for measuring errors of the photomask 100.

Generally, a relatively higher registration error may be generated at a portion of the photomask 100 nearer to a position where a stud 200 is attached.

In an example embodiment, registration errors may be measured before a plurality of studs 200 is attached to the photomask 100. In an example embodiment, when a plurality of studs 200 is attached to the photomask 100, each holder may be controlled to have a pressure and/or a temperature capable of reducing (or, alternatively, minimizing) a registration error. As such, each holder may apply an appropriate pressure and/or heat to each stud 200. Accordingly, the stud attachment device 500 may attach each stud 200 to the photomask 100 while reducing (or, alternatively, minimizing) registration errors of the photomask 100.

In addition, whether or not registration error correction of the photomask 100 is required may be determined based on the measured data. In accordance with registration errors around positions where a plurality of studs 200 is to be attached (for example, four positions where four studs 200 are to be attached, respectively), respective holders are controlled in terms of pressure and/or temperature and, as such, each holder may apply an appropriate pressure and/or heat to the corresponding stud 200. Accordingly, the stud attachment device 500 may correct registration errors of the photomask 100.

When a plurality of studs 200 is attached to the photomask 100 under the condition that the same pressure and/or temperature is applied to the studs 200, a correction effect for registration errors of the photomask 100 exhibiting different error degrees in accordance with different positions may be low.

When pressures and/or temperatures applied to respective studs 200 are independently regulated, as shown in FIG. 7, registration errors of the photomask 100 may be reduced or considerably corrected, as compared to the case in which the same pressure and/or temperature is applied to all studs 200, as shown in FIG. 8. When the pressure and/or temperature applied to one stud 200 is independently regulated, whereas the same pressure and/or temperature is applied to the remaining studs 200, as shown in FIG. 9, registration errors around the former stud 200 may be reduced or considerably corrected, whereas registration errors generated around the remaining studs 200 may be relatively high.

When a plurality of studs 200 is attached to the photomask 100, flatness errors, thickness variation, critical dimension uniformity (CDU) errors and/or imaging errors, in addition to registration errors of the photomask 100, may be reduced through independent regulation of pressure and/or temperature, or correction of such errors may also be corrected.

Referring to FIGS. 1 to 6, after attaching the body 210 to the photomask 100 by the third bonding members 400 through independent application of a pressure and/or heat to each of the plurality of studs 200, the fixtures 340 of the pellicle 200 are coupled to respective heads 230 and, as such, the reticle 10 may be manufactured.

Next, a stud attachment method according to another example embodiment will be described. In the following description, no description will be given of the same constituent elements as those of FIGS. 1 to 9, and similar or identical reference numerals are used.

FIGS. 10 to 13 are schematic perspective views showing a stud attachment device and a photomask in order to explain a stud attachment method according to an example embodiment of the disclosure.

Referring to FIGS. 10 to 13, a stud attachment device 500 may attach respective studs 200 to the photomask 100 at different times through respective holders. For example, the stud attachment device 500 may attach the studs 200 disposed at respective holders in an order of a first holder 511, a second holder 512, a third holder 513, and a fourth holder 514.

For example, the stud 200 laid on the first holder 511 may first be attached to the photomask 100. In this case, the second holder 512, the third holder 513 and the fourth holder 514 are set to have minimum pressures p2', p3' and p4', respectively, and a pressure p1 of the first holder 511 may be set to be higher than the pressures p2', p3' and p4' of the second holder 512, the third holder 513 and the fourth holder 514. Correspondingly, the second holder 512, the third holder 513 and the fourth holder 514 have smallest heights, respectively, and a height of the first holder 511 may be greater than the heights of the second holder 512, the third holder 513 and the fourth holder 514.

Subsequently, the stud 200 laid on the second holder 512 may be attached to the photomask 100. In this case, the first holder 511, the third holder 513 and the fourth holder 514 may be set to have minimum pressures p1', p3' and p4', respectively, and a pressure p2 of the second holder 512 may be set to be greater than the pressures p1', p3' and p4' of the first holder 511, the third holder 513 and the fourth holder 514. Correspondingly, the first holder 511, the third holder 513 and the fourth holder 514 have smallest heights, respectively, and a height of the second holder 512 may be greater than the heights of the first holder 511, the third holder 513 and the fourth holder 514.

Thereafter, the stud 200 laid on the third holder 513 may be attached to the photomask 100. In this case, the first holder 511, the second holder 512 and the fourth holder 514 may be set to have minimum pressures p1', p2' and p4', respectively, and a pressure p3 of the third holder 513 may be set to be greater than the pressures p1', p2' and p4' of the first holder 511, the second holder 512 and the fourth holder 514. Correspondingly, the first holder 511, the second holder 512 and the fourth holder 514 have smallest heights, respectively, and a height of the third holder 513 may be greater than the heights of the first holder 511, the second holder 512 and the fourth holder 514.

Subsequently, the stud 200 laid on the fourth holder 514 may be attached to the photomask 100. In this case, the first holder 511, the second holder 512 and the third holder 513 may be set to have minimum pressures p1', p2' and p3', respectively, and a pressure p4 of the fourth holder 514 may be set to be greater than the pressures p1', p2' and p3' of the first holder 511, the second holder 512 and the third holder 513. Correspondingly, the first holder 511, the second holder 512 and the third holder 513 have smallest heights, respectively, and a height of the fourth holder 514 may be greater than the heights of the first holder 511, the second holder 512 and the third holder 513.

When the studs 200 are attached to the photomask 100 at different times through respective holders 511 to 514, correction effects for registration errors at different positions may be enhanced.

In accordance with the example embodiments of the disclosure, registration errors generated when a pellicle is attached to a photomask may be reduced (or, alternatively, minimized) or may be corrected.

Effects according to example embodiments of the disclosure are not limited to the above contents, and a wider variety of effects may be included in example embodiments of the disclosure.

While some example embodiments of the disclosure have been described with reference to the accompanying drawings, it should be understood by those skilled in the art that various modifications may be made without departing from the scope of the disclosure. Therefore, the above-described example embodiments should be considered in a descriptive sense only and not for purposes of limitation.

What is claimed is:

1. A stud attachment device configured to attach a plurality of studs to a photomask, the stud attachment device comprising:
    a body;
    a plurality of holders extending from the body, the plurality of holders configured to receive the plurality of studs laid on respective ones thereof; and
    a pressure regulator configured to independently control pressures of the plurality of holders by adjusting heights of the plurality of holders while the stud attachment device attaches the plurality of studs to the photomask.

2. The stud attachment device according to claim 1, further comprising:
    a temperature regulator configured to independently control temperatures of the plurality of holders while the stud attachment device attaches the plurality of studs to the photomask.

3. The stud attachment device according to claim 2, wherein the plurality of holders are configured to apply heat to the plurality of studs, respectively, such that, while the stud attachment device attaches the plurality of studs to the photomask, a temperature of the heat applied to at least one of the plurality of studs is different from remaining ones of the plurality of studs.

4. The stud attachment device according to claim 1, wherein the plurality of holders are configured to move upwards and downwards.

5. The stud attachment device according to claim 4, wherein the plurality of holders are configured to move such that the heights of the plurality of holders are different while the stud attachment device attaches the plurality of studs to the photomask.

6. The stud attachment device according to claim 1, wherein each of the plurality of studs comprises:
    a head;
    a plate-shaped body having a bonding member attached to one surface thereof; and
    a post connecting the head and the plate-shaped body to each other.

7. The stud attachment device according to claim 1, wherein the plurality of studs are configured to couple the photomask to a pellicle to form a reticle that includes the photomask, the pellicle and the plurality of studs.

8. The stud attachment device according to claim 7, wherein the pellicle comprises:
    a thin-film membrane having a transmissivity of about 80% or more for extreme ultraviolet (EUV) light;
    a plurality of fixtures configured to couple to respective ones of the plurality of studs; and
    a frame configured to support the thin-film membrane, the frame including a plurality of grooves configured to receive respective ones of the plurality of fixtures.

9. The stud attachment device according to claim 1, wherein the photomask comprises:
    a first surface including a mask pattern; and
    a second surface opposite the first surface, the second surface being harder than the first surface including the mask pattern.

10. The stud attachment device according to claim 9, wherein the plurality of studs is directly attached to the first surface through a bonding member.

11. The stud attachment device according to claim 9, wherein the photomask further comprises:
    an alignment key on the first surface outside the mask pattern.

12. A method of attaching a plurality of studs to a photomask using a stud attachment device, the stud attachment device including a body, and a plurality of holders extending from the body, the plurality of holders configured to receive the plurality of studs laid on respective ones thereof, the method comprising:
    measuring registration errors of the photomask;
    attaching the plurality of studs to the photomask; and
    independently controlling one or more of pressures by adjusting heights of the plurality of holders or temperatures of the plurality of holders while the stud attachment device attaches the plurality of studs to the photomask.

13. The method according to claim 12, wherein:
    the photomask includes a first surface and a second surface opposite the first surface, the first surface including a mask pattern, and the second surface being harder than the first surface; and wherein the attaching comprises:
    disposing the first surface to face downwards while the stud attachment device attaches the plurality of studs to the photomask.

14. The method according to claim 13, wherein the attaching comprises:
    applying a force to the plurality of studs in an upward direction upon attaching the plurality of studs to the photomask.

15. The method according to claim 12, wherein the independently controlling comprises:
    independently controlling the one or more of the pressures or temperatures of the plurality of holders based on the registration errors.

16. The method according to claim 12, wherein the attaching comprises:
    attaching the plurality of studs to the photomask via respective ones of the plurality of holders at different times.

17. A stud attachment device configured to attach a plurality of studs to a photomask, the stud attachment device comprising:
    a body;
    a plurality of holders extending from the body, the plurality of holders configured to receive the plurality of studs laid on respective ones thereof;
    a pressure regulator configured to independently control pressures of the plurality of holders by adjusting heights of the plurality of holders while the stud attachment device attaches the plurality of studs to the photomask; and a temperature regulator configured to independently control temperatures of the plurality of holders while the stud attachment device attaches the plurality of studs to the photomask, wherein the plurality of studs are configured to couple the photomask to a pellicle to form a reticle that includes the photomask, the pellicle, and the plurality of studs, and the pellicle includes, a thin-film membrane having a transmissivity of about 80% or more for extreme ultraviolet (EUV) light, a support member at an edge of the thin-film membrane, the support member configured to support the thin-film membrane, a plurality of fixtures configured to couple to respective ones of the plurality of studs, and a frame including a plurality of grooves configured to receive respective ones of the plurality of fixtures, the frame configured to support the support member.

18. The stud attachment device according to claim 17, wherein the frame and the photomask are spaced apart from each other.

19. The stud attachment device according to claim 17, wherein:

each of the plurality of studs includes a head configured to lay on a respective one of the plurality of holders prior to the stud attachment device attaching the plurality of studs to the photomask, the head configured to couple to a corresponding one of the plurality of fixtures of the pellicle, a plate-shaped body having a bonding member attached to one surface thereof, the bonding member configured to attach the plate-shaped body to the photomask, and a post connecting the head and the plate-shaped body to each other.

\* \* \* \* \*